United States Patent
Freeman et al.

(10) Patent No.: US 12,098,294 B2
(45) Date of Patent: *Sep. 24, 2024

(54) MULTIAMINE LIGANDS FOR NANOPARTICLE SOLUBILIZATION AND INK COMPOSITIONS CONTAINING NANOPARTICLES CAPPED WITH THE LIGANDS

(71) Applicant: Kateeva, Inc., Newark, CA (US)

(72) Inventors: William P. Freeman, San Mateo, CA (US); Elena Rogojina, San Jose, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/305,782

(22) Filed: Apr. 24, 2023

(65) Prior Publication Data
US 2023/0303875 A1   Sep. 28, 2023

Related U.S. Application Data

(60) Division of application No. 17/648,326, filed on Jan. 19, 2022, now Pat. No. 11,661,524, which is a
(Continued)

(51) Int. Cl.
*B82Y 40/00* (2011.01)
*C01B 33/113* (2006.01)
(Continued)

(52) U.S. Cl.
CPC ............ *C09D 11/38* (2013.01); *C01B 33/113* (2013.01); *C01F 7/02* (2013.01); *C01G 23/04* (2013.01);
(Continued)

(58) Field of Classification Search
CPC ............ C09K 2323/05; C09K 2323/00; C09K 2323/03; C09K 11/02; C09D 11/40;
(Continued)

(56) References Cited

U.S. PATENT DOCUMENTS 11,261,339 B2   3/2022   Freeman et al.
11,661,524 B2   5/2023   Freeman et al.
(Continued)

FOREIGN PATENT DOCUMENTS

| CN | 103396683 A | 11/2013 |
|---|---|---|
| CN | 105188719 A | 12/2015 |
| CN | 106795386 A | 5/2017 |

OTHER PUBLICATIONS

Advisory Action dated May 13, 2021 for U.S. Appl. No. 16/574,246.
(Continued)

*Primary Examiner* — Ruiyun Zhang
(74) *Attorney, Agent, or Firm* — Hauptman Ham, LLP

(57) ABSTRACT

Ligand-capped scattering nanoparticles, curable ink compositions containing the ligand-capped scattering nanoparticles, and methods of forming films from the ink compositions are provided. Also provided are cured films formed by curing the ink compositions and photonic devices incorporating the films. The ligands bound to the inorganic scattering nanoparticles include a head group and a tail group. The head group includes a polyamine chain and binds the ligands to the nanoparticle surface. The tail group includes a polyalkylene oxide chain.

20 Claims, 4 Drawing Sheets

Related U.S. Application Data continuation of application No. 16/574,246, filed on Sep. 18, 2019, now Pat. No. 11,261,339.

(60) Provisional application No. 62/742,937, filed on Oct. 9, 2018.

(51) Int. Cl.

| | |
|---|---|
| *C01F 7/02* | (2022.01) |
| *C01G 23/04* | (2006.01) |
| *C01G 25/02* | (2006.01) |
| *C09D 11/38* | (2014.01) |
| *G02B 1/10* | (2015.01) |
| *H01L 31/0352* | (2006.01) |
| *G02F 1/1335* | (2006.01) |
| *G02F 1/13357* | (2006.01) |
| *H01L 31/0216* | (2014.01) |

(52) U.S. Cl.
CPC .............. *C01G 25/02* (2013.01); *G02B 1/10* (2013.01); *H01L 31/035218* (2013.01); *B82Y 40/00* (2013.01); *C01P 2004/64* (2013.01); *C01P 2004/90* (2013.01); *C01P 2006/90* (2013.01); *C09K 2323/00* (2020.08); *C09K 2323/03* (2020.08); *C09K 2323/05* (2020.08); *G02F 1/133504* (2013.01); *G02F 1/133507* (2021.01); *G02F 1/133617* (2013.01); *H01L 31/02162* (2013.01)

(58) Field of Classification Search
CPC ..... C09D 11/38; B82Y 40/00; C01P 2004/64; C01P 2004/90; C01P 2006/90; H01L 31/035218; H01L 31/02162; H01L 51/0005; G02F 1/133504; G02F 1/133617; G02F 2001/133507
USPC .............. 428/1.3, 1.31, 1.5, 206; 106/31.13; 252/301.36; 977/834, 827, 830
See application file for complete search history.

(56) References Cited

U.S. PATENT DOCUMENTS

| | | |
|---|---|---|
| 2009/0198009 A1 | 8/2009 | Matsuki et al. |
| 2011/0165647 A1 | 7/2011 | Fernig et al. |
| 2011/0180764 A1 | 7/2011 | Takahashi et al. |
| 2012/0045398 A1 | 2/2012 | Pöselt et al. |
| 2015/0002521 A1 | 1/2015 | McCarthy et al. |
| 2018/0102449 A1 | 4/2018 | Pschenitzka et al. |

OTHER PUBLICATIONS

Final Office Action issued Mar. 9, 2021 in U.S. Appl. No. 16/574,246.
International Search Report issued Dec. 4, 2019 to PCT/US19/51627.
Kind et al., PEO-PEI block copolymers for in situ formation of silica particles, Colloid Polym. Sci., V288, P18645-1650 (Year: 2010).
Nikolic et al. "Micelle and Vesicle Formation of Amphiphilic Nanoparticles" 2009, Agnew. Chem., vol. 121, p. 2790-2792. (Year 2009).
Non-Final Office Action issued Dec. 11, 2020 to U.S. Appl. No. 16/574,246.
Non-Final Office Action dated Jul. 6, 2021 for U.S. Appl. No. 16/574,246.
Notice of Opinion of First Review issued Aug. 31, 2022 for CN Patent Application No. 201980066185.7.
Qi et al. Synthesis and Charaterization of CdS Nanoparticles Stabalized by Double-Hydrophyllic Block Copolymers, Nano Letters vol. 1, No. 2, Dec. 13, 2000. pp. 61-65.
Sidorov et al., Stabilization of Metal nanoparticles by PEO-PEI block copolymers, J. Colloid and Interface Sci., V212, P197-211 (Year: 1999).
Notice of Allowance issued Jan. 24, 2023 in U.S. Appl. No. 17/648,326.
Non-Final Office Action issued Dec. 9, 2020 in U.S. Appl. No. 17/648,326.

MULTIAMINE LIGANDS FOR NANOPARTICLE SOLUBILIZATION AND INK COMPOSITIONS CONTAINING NANOPARTICLES CAPPED WITH THE LIGANDS

CROSS-REFERENCE TO RELATED APPLICATIONS

This application is a divisional of U.S. patent application Ser. No. 17/648,326, filed on Jan. 19, 2022, which is a continuation of U.S. patent application Ser. No. 16/574,246, filed Sep. 18, 2019, now U.S. Pat. No. 11,261,339, issued on Mar. 1, 2022, which claims the benefit of U.S. Provisional Patent Application No. 62/742,937 filed Oct. 9, 2018, the entire contents of which are incorporated herein by reference.

BACKGROUND

In order to obtain high-performance photonic devices that include polymeric optical films containing scattering particles and quantum dot (QD) phosphors, the scattering particles and the phosphor particles should be uniformly spaced within the film because microdomains with higher scattering particle and/or phosphor particle concentrations can impact the external quantum efficiency and the emission properties of the device by creating a non-uniformity of light conversion and out-coupling. Unfortunately, scattering nanoparticles and QD phosphor particles tend to aggregate in polymeric films, which may result in a non-uniform particle distribution.

SUMMARY

Ligand-capped nanoparticles, curable ink compositions containing the ligand-capped nanoparticles, and methods of forming films from the ink compositions are provided. Also provided are cured films formed by curing the ink compositions and photonic devices incorporating the films.

One embodiment of a ligand-capped nanoparticle includes: an inorganic nanoparticle having a surface; and a plurality of ligands bound to the surface of the nanoparticle. The one or more of the ligands include: a head group comprising a polyamine chain, wherein the head group is bound to the surface of the nanoparticle; and a tail group comprising a polyalkylene oxide chain.

One embodiment of an ink composition includes: curable monomers; and a plurality of the above-described ligand-capped nanoparticles mixed with the curable monomers.

One embodiment of a film-coated substrate includes: a substrate; and a film comprising the polymerization product of the above-described ink composition on a surface of the film.

One embodiment of a method of forming a film in a photonic device includes the steps of: inkjet printing a layer of the above-described ink composition on a device substrate of the photonic device; and curing the ink composition.

BRIEF DESCRIPTION OF THE DRAWINGS

Illustrative embodiments of the invention will hereafter be described with reference to the accompanying drawings, wherein like numerals denote like elements.

DETAILED DESCRIPTION

Figure 1:
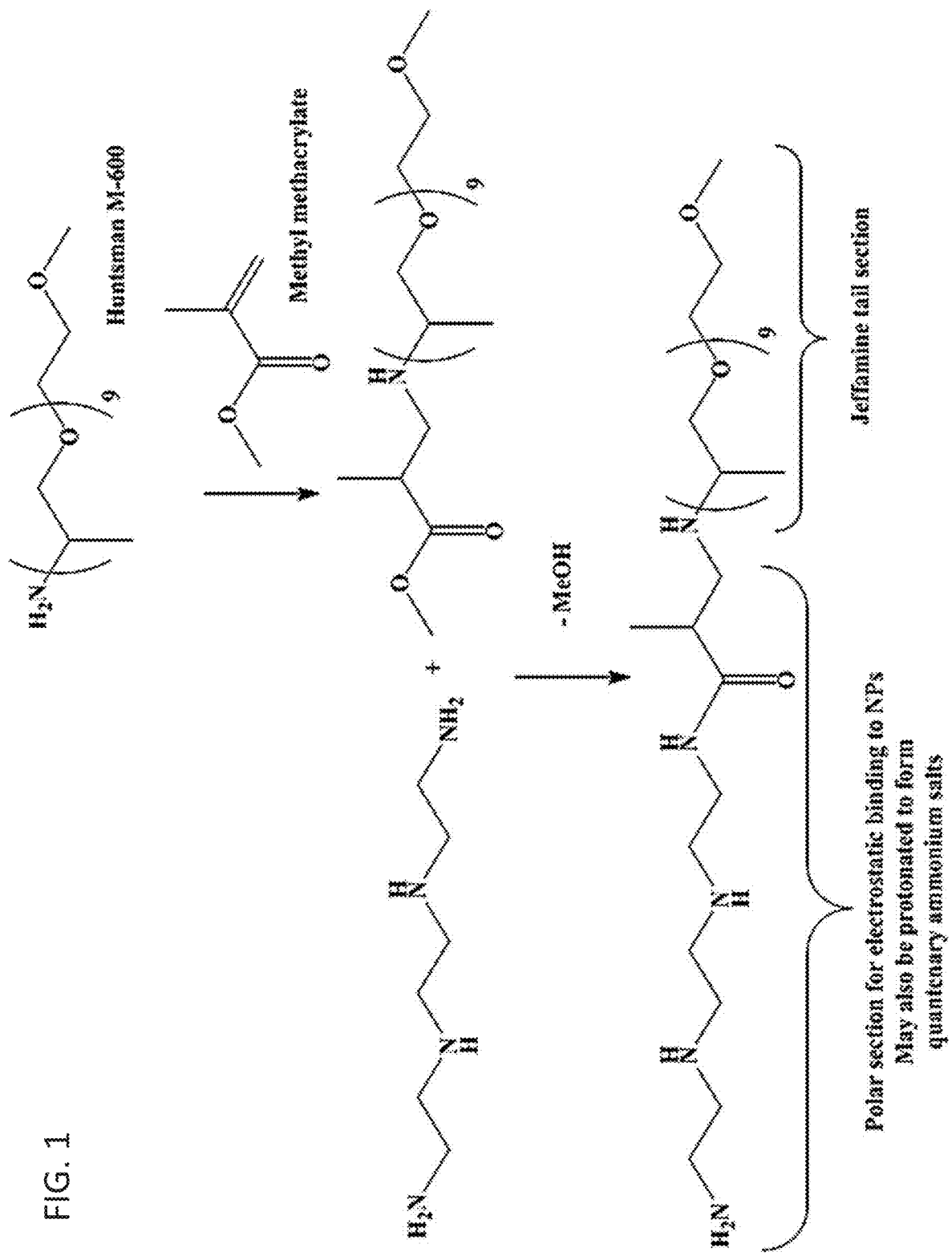
FIG. 1. One embodiment of a reaction scheme for the synthesis of a ligand having a multiamine head group.

Ligand-capped nanoparticles, curable ink compositions containing the ligand-capped nanoparticles, and method of forming films from the ink compositions are provided. Also provided are cured films formed by curing the ink compositions and photonic devices incorporating the films. The films can be incorporated as light-scattering layers in a variety of photonic devices. Some embodiments of the ink compositions include ligand-capped QDs. Films made from these ink compositions can be used as color filter layers and color enhancement layers in devices such as liquid crystal displays (LCDs) or light emitting diode (LED) displays, including a micro-LED display, where a micro-LED display refers to an LED display having a pixel size of no greater than about 10 µm. Examples of devices into which the films can be incorporated as color filter layers or color enhancement layers are described in U.S. patent application publication number U.S. 2018/0102449.

The ligands enhance the solubility of the scattering nanoparticles in the ink compositions and prevent or reduce the flocculation of the scattering nanoparticles with other scattering nanoparticles or QDs in the ink compositions. As a result, the ligands allow for higher scattering nanoparticle concentrations in the ink compositions and for more uniform separation of the scattering nanoparticles and QDs in films made from the ink compositions, relative ink compositions, and films in which the scattering nanoparticles are not capped with the ligands.

The ligand-capped scattering nanoparticles include an inorganic nanoparticle and a plurality of ligands bound to the surface of the inorganic nanoparticle. As used herein, the term nanoparticle refers to a particle having at least one dimension, such as a diameter, that is no greater than about 1000 nm. However, aggregates of multiple nanoparticles may have a larger overall particle size. The scattering nanoparticles may take on a variety of shapes, including substantially spherical shapes in which all cross-sectional dimensions of the particles are less than 1000 nm, elongated shapes, such as nanowires, in which at least two of the cross-sectional dimensions of the particles are less than 1000 nm, and substantially planar shapes, such as nanoplates, in which at least one cross-sectional dimension of the particles is less than 1000 nm.

Light scattering nanoparticles may be geometric scattering nanoparticles (GSNPs) or plasmonic scattering nanoparticles (PSNPs). GSNPs are characterized in that they accomplish light scattering by reflection, refraction, and diffraction at the surface of the nanoparticle. Examples of GSNPs include metal oxide nanoparticles, such as nanoparticles of zirconium oxide (i.e. zirconia), titanium oxide (i.e. titania) and aluminum oxide (i.e. alumina), and metalloid oxide nanoparticles, such as silicon dioxide.

A PSNP is characterized in that incident light excites an electron density wave in the nanoparticle that creates a local oscillating electric field extending out from the surface of the nanoparticle. In addition to the scattering effect of the particle, if a PSNP is in close proximity to one or more QDs, this electric field can couple to the QDs, thereby enhancing the absorption of the QD layer. Examples of PSNPs include metal nanoparticles, such as silver nanoparticles and gold nanoparticles.

For applications in which the scattering nanoparticles are used to scatter light, the nanoparticle dimensions should be tailored to achieve the scattering of light at the intended wavelengths. The GSNPs will typically be larger than the PSNPs, and both types of particles will generally be larger than the QDs in an ink composition. By way of illustration only, in various embodiments of the ligand-capped nanoparticles and the ink compositions and films formed therefrom, the GSNPs have an effective size in the range from about 200 nm to about 1 □m, and the PSNPs have an effective size in the range from about 30 nm to about 200 nm.

The ligands bound to the scattering nanoparticles include a head group and a tail group. The head group includes a polyamine chain and binds the ligands to the scattering nanoparticle surface via electrostatic interactions between the scattering nanoparticle surface and functional groups on the head group. The scattering nanoparticles may have only one type of ligand bound to their surfaces or may have two or more different types of ligands bound to their surfaces.

The tail group includes a polyalkylene oxide chain extending away from the scattering nanoparticle surface and serves to render the scattering nanoparticle more soluble in an ink composition. The ligands can be synthesized from polyetheramines, as illustrated in the Example. Examples of commercially available polyetheramines that can be used are sold by Huntsman International LLC under the tradename Jeffamine®. In some embodiments, the polyalkylene oxide chain is a polyethylene oxide chain, and in some embodiments the polyalkylene oxide chain is a polypropylene oxide chain. By way of illustration, the tail groups may have the following structure:

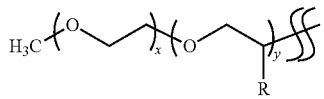

where x and y represent the number of repeat units in the chain, and R is H or $CH_3$. In various embodiments of the tail groups, x and y are in the range from 1 to 31. Examples of Jeffamines that can be used to form ligands with this tail group structure include Jeffamine® M-600 (x=9; y=1), M-1000 (x=3; y=19), M-2005 (x=29; y=6), and M-2070 (x=10; y=31).

The polyamine chains of the head groups include two or more amine groups and can be linear or branched polyamines. Some embodiments of the polyamine chains include at least three amine groups, and some embodiments of the polyamine chains include at least four amine groups. The amines may be uncharged amines, such as primary and secondary amines, or they may be charged quaternary amines (also referred to as quaternary ammonium ions) in which the nitrogen atom of an amine group has four groups bonded to it, including two or three hydrogen atoms.

Ligands that do not include charged (cationic) amine groups can bond to the surface of a scattering nanoparticle via electrostatic interactions between the polar head groups and the scattering nanoparticle surface. However, ligands that include one or more cationic quaternary amine groups can bond more strongly to the scattering nanoparticles via electrostatic interaction between the charged amine groups and surface charges on the scattering nanoparticle. Uncharged amine groups, such as primary and secondary amine groups, can be converted into cationic quaternary amine groups by protonating the uncharged amine groups to convert them into ammonium salts, as illustrated in the Example. The counter ions of the salts can be adjusted by using different acids during the ammonium salt synthesis. The counter ions may be inorganic or organic. Organic counter ions, such as para-toluene sulfonate, can be used to increase the initial solubility of the ligands in the ink compositions.

Ink compositions that include the ligand-capped scattering nanoparticles further include one or more curable monomers. The ink compositions may, optionally, also include one or more multifunctional crosslinking agents and/or one or more cure initiators. The ink compositions can include more than one type of scattering particle. For example, various embodiments of the ink compositions contain a mixture of ligand-capped PSNPs and ligand-capped GSNPs. As used herein, a curable monomer is a monomer that polymerizes with other monomers and/or crosslinks with a crosslinking agent to form a polymer. The compositions described herein are referred to as "ink compositions" because various embodiments of the compositions can be applied using techniques, including printing techniques, by which conventional inks have been applied to substrates. Such printing techniques include, for example, inkjet printing, screen printing, thermal transfer printing, flexographic printing, and/or offset printing. However, the ink compositions can also be applied using other coating techniques, such as, for example, spray coating, spin coating, and the like. Moreover, the ink compositions need not contain colorants, such as dyes and pigments, which are present in some conventional ink compositions.

Some embodiments of the ink compositions also include ligand-capped QDs, where a ligand-capped QD is a QD having a surface with a plurality of ligands bound to it. As used herein, the term QD refers to small, crystalline, inorganic phosphor particles that absorb incident radiation of a given wavelength or wavelength range and convert the incident radiation into emitted radiation having a different wavelength or a different wavelength range, which is emitted from the QDs within a very narrow part of the optical spectrum. The wavelengths of radiation absorbed and emitted by the QDs depend on their size. Thus, by incorporating QDs of appropriates sizes and materials in appropriate concentrations and ratios into a film, that film can be designed to absorb light of one color (e.g., blue light) and convert at least a portion of it into light of a different color (e.g., red or green light). For the purposes of this disclosure, QDs that absorb blue light and convert it into red light are referred to as red-emitting QDs, and QDs that absorb blue light and convert it into green light are referred to as green-emitting QDs. Examples of QDs include group III-V semiconductor QDs, such as InP QDs; Group II-VI semiconductor QDs, such as ZnS QDs, ZnSe QDs, and cadmium-VI QDs (e.g., CdSe QDs and CdS QDs); Group IV semiconductor QDs, such as Si QDs, Ge QDs, and SiGe QDs; and perovskite QDs, such as lead-containing QDs.

Like the ligands that are bound to the scattering nanoparticles (referred to as nanoparticle ligands), the ligands bound to the QDs (referred to as QD ligands) have a head group that is bound to the QD surface and an organic tail group that renders the QD more soluble in an ink composition. In some embodiments of the QD ligands, the tail group includes a polyalkylene oxide chain. The head group includes one or more functional groups that are typically bound to the QD surface via electrostatic bonding. Examples of such functional groups that can be included in a QD ligand head group include carboxyl (—COOH) groups and amine groups (e.g., —NR$_2$ groups, where R is an H atom or an alkyl group). The head group may also include one or more thiol (—SH) functional groups, which are covalently bound to the surface.

The organic tail groups of the QD ligands are compatible with the tail groups of the nanoparticle ligands and, as such, enhance the solubility of the QDs in the ink compositions and prevent or reduce the flocculation of the QDs with other QDs or scattering nanoparticles in the ink compositions. Examples of polyalkylene oxide chains that can be present in the tail groups include polyethylene oxide and polypropylene oxide. The tail groups on the QD ligands may be the same as or different from those of the scattering nanoparticle ligands in the same ink composition.

The curable monomers are characterized in that they have one or more functional groups with polymerizable double bonds, such as acrylate or methacrylate groups. Examples of curable acrylate monomers include di(meth)acrylate monomers, mono(meth)acrylate monomers, and mixtures thereof. As used herein, the phrase "(meth)acrylate monomer" indicates that the recited monomer may be an acrylate or a methacrylate.

Various embodiments of the ink compositions include: one or more curable di(meth)acrylate monomers, one or more curable mono(meth)acrylate monomers, or a mixture of one or more curable di(meth)acrylate monomers with one or more mono(meth)acrylate monomers, ligand-capped scattering nanoparticles, and ligand-capped QDs.

By way of illustration, some embodiments of the ink compositions include: (a) 10 wt. to 96 wt. % di(meth)acrylate monomer or a combination of di(meth)acrylate monomer and mono(meth)acrylate monomer; (b) 4 wt. % to 10 wt. % multifunctional (meth)acrylate crosslinking agent; (c) 0.1 wt. % to 30 wt. % ligand-capped scattering nanoparticles; and (d) 1 wt. % to 50 wt. ligand-capped QDs. Generally, the total concentration of the ligand-capped scattering nanoparticles and the ligand-capped QDs will be no greater than about 50 wt. %. By way of illustration, ink compositions having a total concentration of ligand-capped scattering nanoparticles and ligand-capped QDs in the range from 40 wt. % to 45 wt. % can be formulated. However, concentrations outside of these ranges can be used. If the ink compositions are free of volatile organic solvents, the concentration of the ligand-capped scattering nanoparticles and ligand-capped QDs in the cured films will correspond to their concentration in the ink compositions that are used to form the cured films. However, if a film with a higher concentration of scattering nanoparticles and/or QDs is desired, volatile organic solvents, such as toluene, can be included in the ink compositions to render the ligand-capped scattering nanoparticles and/or ligand-capped QDs more soluble. Cured films made from such solvent-containing ink compositions can have a total ligand-capped scattering nanoparticle plus ligand-capped QD concentration of, for example, up to 60 wt. % or up to 70 wt. %.

In some embodiments of the ink compositions, cure initiators, such as photoinitiators or thermal initiators, are included. By way of illustration, the cure initiators can be present in amounts in the range from about 0.1 wt. % to about 20 wt. %.

The mono(meth)acrylate and di(meth)acrylate monomers are ether and/or ester compounds that have thin film-forming properties and that serve as a binder material upon curing. As components of a liquid ink composition, these monomers can provide compositions that are jettable at a range of inkjet printing temperatures, including room temperature. However, the liquid ink compositions can be applied by other means, including slot-die coating and spin coating. Generally, for ink compositions useful for inkjet printing applications, the surface tension, viscosity, and wetting properties of the ink compositions should be tailored to allow the compositions to be dispensed through an inkjet printing nozzle without drying onto or clogging the nozzle at the temperature used for printing (e.g., room temperature, ~22° C., or at higher temperatures up to, for example, about 70° C.). Once formulated, various embodiments of the ink compositions can have a viscosity of, for example, between about 2 cps and about 30 cps (including, for example, between about 10 cps and about 27 cps and between about 14 cps and about 25 cps) at a temperature in the range from 22° C. to 70° C. and a surface tension of between about 25 dynes/cm and about 45 dynes/cm (including, for example, between about 30 dynes/cm and about 42 dynes/cm and between about 28 dynes/cm and about 38 dynes/cm) at a temperature in the range from 22° C. to 70° C. Methods for measuring viscosities and surface tensions are well known and include the use of commercially available rheometers (e.g., a DV-I Prime Brookfield rheometer) and tensiometers (e.g., a SITA bubble pressure tensiometer).

The mono(meth)acrylate monomers and di(meth)acrylate monomers can be, for example, linear aliphatic mono(meth)acrylates and di(meth)acrylates or can include cyclic and/or aromatic groups. In various embodiments of the inkjet printable ink compositions, the mono(meth)acrylate monomers and/or di(meth)acrylate monomers are polyethers. The monomers are desirably polar, low vapor pressure monomers with relatively high boiling points.

Suitable (meth)acrylate monomers include, but are not limited to: alkyl or aryl (meth)acrylates, such as methyl (meth)acrylate, ethyl (meth)acrylate, benzyl (meth)acrylate, and vinyl benzyl (meth)acrylate; cyclic trimethylolpropane formal (meth)acrylate; alkoxylated tetrahydrofurfuryl (meth)acrylate; phenoxyalkyl (meth)acrylates, such as 2-phenoxyethyl (meth)acrylate and phenoxymethyl (meth)acrylate; 2(2-ethoxyethoxy)ethyl (meth)acrylate; tricyclodecanedimethanol diacrylate; and 2-[[(butylamino) carbonyl]oxy]ethyl acrylate. Other suitable di(meth)acrylate monomers include 1,6-hexanediol diacrylate; 1,12 dodecanediol di(meth)acrylate; 1,3-butylene glycol di(meth)acrylate; di(ethylene glycol) methyl ether methacrylate; and polyethylene glycol di(meth)acrylate monomers, including ethylene glycol di(meth)acrylate monomers and polyethylene glycol di(meth)acrylate monomers having a number average molecular weight in the range from, for example, about 230 g/mole to about 440 g/mole. Other mono- and di(meth)acrylate monomers that can be included in various embodiments of the ink compositions, alone or in combination, include dicyclopentenyloxyethyl acrylate (DCPOEA), isobornyl acrylate (ISOBA), dicyclopentenyloxyethyl methacrylate (DCPOEMA), isobornyl methacrylate (ISOBMA), and N-octadecyl methacrylate (OctaM). Homologs of ISOBA and ISOBMA (collectively "ISOB(M)A" homologs) in which one or more of the methyl groups on the ring is replaced by hydrogen can also be used.

In various embodiments of the inkjet printable ink compositions, the di(meth)acrylate monomers are alkoxylated aliphatic di(meth)acrylate monomers. These include neopentyl glycol group-containing di(meth)acrylates, including alkoxylated neopentyl glycol diacrylates, such as neopentyl glycol propoxylate di(meth)acrylate and neopentyl glycol ethoxylate di(meth)acrylate. Various embodiments of the neopentyl glycol group-containing di(meth)acrylates have molecular weights in the range from about 200 g/mole to about 400 g/mole. This includes neopentyl glycol-containing di(meth)acrylates having molecular weights in the range from about 280 g/mole to about 350 g/mole and further includes neopentyl glycol-containing di(meth)acrylates having molecular weights in the range from about 300 g/mole to about 330 g/mole. Various neopentyl glycol group-containing di(meth)acrylate monomers are commercially available. For example, neopentyl glycol propoxylate diacrylate can be purchased from Sartomer Corporation under the tradename SR9003B and also from Sigma Aldrich Corporation under the tradename Aldrich-412147 (~330 g/mole; viscosity ~18 cps at 24° C.; surface tension ~34 dynes/cm at 24° C.). Neopentyl glycol diacrylate also can be purchased from Sigma Aldrich Corporation under the tradename Aldrich-408255 (~212 g/mole; viscosity ~7 cps; surface tension ~33 dynes/cm).

The multifunctional (meth)acrylate crosslinking agents have at least three reactive (meth)acrylate groups. Thus, the multifunctional (meth)acrylate crosslinking agents can be, for example, tri(meth)acrylates, tetra(meth)acrylates, and/or higher functionality (meth)acrylates. Pentaerythritol tetraacrylate or pentaerythritol tetramethacrylate, di(trimethylolpropane) tetraacrylate, and di(trimethylolpropane) tetramethacrylate are examples of multifunctional (meth)acrylates that can be used as a primary cross-linking agent. The term "primary" is used here to indicate that other components of the ink compositions may also participate in crosslinking, although that is not their main functional purpose.

For ink compositions that include photoinitiators, an acylphosphine oxide photoinitiator can be used, though it is to be understood that a wide variety of photoinitiators can be used. For example, photoinitiators from the □-hydroxyketone, phenylglyoxylate, and □-aminoketone classes of photoinitiators can also be used. For initiating a free-radical based polymerization, various classes of photoinitiators can have an absorption profile of between about 200 nm to about 400 nm. For various embodiments of the ink compositions and methods of printing disclosed herein, 2,4,6-trimethylbenzoyl-diphenylphosphine oxide (TPO) and 2,4,6-trimethylbenzoyl-diphenyl phosphinate have desirable properties. Examples of acylphosphine photoinitiators include initiators for UV curing sold under the tradenames Irgacure® TPO (also previously available under the tradename Lucirin® TPO), a type I hemolytic initiator with absorption at 380 nm; Irgacure® TPO-L, a type I photoinitiator that absorbs at 380 nm; and Irgacure® 819 with absorption at 370 nm. By way of illustration, a light source emitting at a nominal wavelength in the range from 350 nm to 395 nm at a radiant energy density of up to 1.5 J/cm$^2$ could be used to cure an ink composition comprising a TPO photoinitiator.

Although various embodiments of the ink compositions described herein include photoinitiators, other types of initiators can be used instead of, or in addition to, the photoinitiators. For example, other suitable cure initiators include thermal initiators such as 2,2'-azobis(2-methylpropionitrile) (AIBN), 4,4'-Azobis(4-cyanovaleric acid) (ABCVA, or ACVA), and initiators that induce polymerization using other types of energy, such as electron beam initiators.

Acrylate-based ink compositions to which the ligand-capped scattering nanoparticles and ligand-capped QDs can be added include those described in U.S. patent application publication number 2016/0024322 filed on Jul. 22, 2015, in U.S. patent application publication number 2017/0062762 filed on Jul. 19, 2016, in U.S. patent application publication number 2018/0102449 filed on Oct. 6, 2017, in U.S. patent application publication number 2017/0358775 filed on Jun. 10, 2016, and in U.S. patent application publication number 2018/0026234 filed on Jul. 18, 2017, the entire contents of which are incorporated herein by reference.

An ink composition can be inkjet printed by jetting the ink composition through an inkjet nozzle in an inkjet printhead onto a substrate. The ink compositions can be printed in ambient air or in an inert environment using a printing system, such as that described in U.S. Pat. No. 8,714,719, which is incorporated herein in its entirety. The films can be cured in ambient air or in an inert environment using UV radiation, thermal energy, or other forms of energy (e.g., e-beam). During curing, volatile components in the ink compositions are removed and curable monomers are polymerized into polymer chains to form a cured film.

Figure 4:
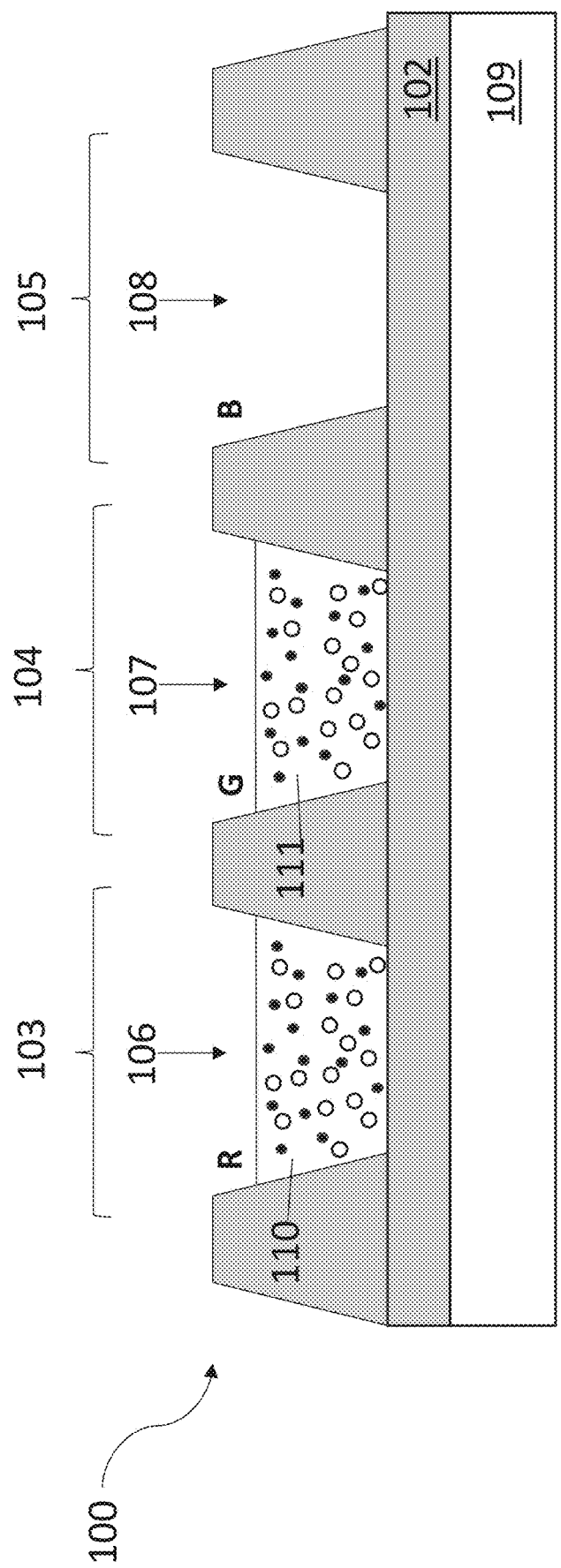
FIG. 4. Schematic diagram of a basic embodiment of a red-green-blue (RGB) pixel with an organic light-emitting diode back-light unit (BLU).

The ink compositions can be formed into films in a photonic device by inkjet printing a layer of an ink composition on a device substrate of the photonic device and curing the ink composition into a film. For example, the ink compositions can be printed into a sub-pixel well of a color filter of an LCD device or over a light guide plate of an LCD device. By way of illustration, the films can be incorporated into the red, green, and/or blue sub-pixels of an RGB pixel that includes a red (R) sub-pixel, a green (G) sub-pixel, and a blue (B) sub-pixel. A basic embodiment of an RGB pixel is shown in FIG. 4. Although only a single pixel is depicted in the figure, the pixel may be part of a larger array of multiple pixels. In this embodiment, the pixel 100 includes: an optically transparent substrate 102; a red (R) sub-pixel 103; a green (G) sub-pixel 104; and a blue (B) sub-pixel 105. Each of the sub-pixels is defined by a sub-pixel well (106, 107, 108). The sub-pixel wells can be fabricated in a black matrix material using photolithography. The black matrix material separates and defines the sub-pixels and prevents light leakage between the sub-pixels. Suitable substrates upon which the black matrix material can be deposited and the sub-pixels fabricated include glass, polymers, and gallium nitride (GaN). However, other substrates can be used. The substrates may optionally include a surface coating, such as silicon nitride or polymer coating.

The optically transparent substrate is back lit using a BLU 109 that emits blue light. The BLU can be, for example, a blue LED with a diffuser or a blue organic light emitting diode (OLED). Alternatively, the BLU can be a GaN based LED grown on a GaN substrate, in which case, the sub-pixel wells can be formed directly over the GaN substrate. As shown in FIG. 4, a single diffuse backlight can be used to illuminate all of the sub-pixels. However, it is also possible to integrate discrete micro-LEDs into the substrate beneath each sub-pixel well, such that each sub-pixel has its own blue light source. Red sub-pixel 103 includes a red color filter layer 110 that includes red-emitting ligand-capped QDs (represented by solid circles) and ligand-capped scattering nanoparticles (represented by open circles). Similarly, green sub-pixel 104 includes a green color filter layer 111 that includes green-emitting ligand-capped QDs (represented by solid circles) and ligand-capped scattering nanoparticles (represented by open circles). Although not shown here, blue sub-pixel 105 may also include a color filter layer that includes ligand-capped scattering nanoparticles and, optionally, blue-emitting ligand-capped QDs. Although BLU 109 and substrate 102 are shown to be in direct contact in the device of FIG. 4, there may be intervening layers, provided that color filter layers 110 and 111 are in the optical path of blue light that is emitted by BLU 109. Examples of intervening layers include capping layers, thin film encapsulation layers, buffer layers, and/or simply an air gap between adjacent layers.

The pixel wells shown in FIG. 4 can be formed by a photolithography process on a polymeric layer. In this case, the photolithography process creates openings in the polymer layer which then act as ink containment features. However, the features that confine the deposited ink compositions (confinement features) need not be physical wells (e.g., defined by a side-wall and a base). Instead, the confinement features can be any substrate structure and/or attribute that confines the ink compositions and prevents it from spreading beyond the boundaries of its sub-pixel. For example, a confinement feature can be provided by a local change in the surface energy on a wafer substrate. In that case, the ink confinement is achieved by the ink pinning on the substrate due to the local change in surface energy. No physical ink containment is present; the area of the substrate having the local change in surface energy serves as a confinement feature. In yet another option, the overall surface energy of the substrate is dialed in in such a way that the ink spreads in such a way that no physical pixel well is necessary because the surface energy of the wafer which provides containment provides the ink composition confinement. Thus, while the pixels described herein are illustrated by embodiments that use physical sub-pixel wells, the wells in those embodiments can be replaced by other confinement features.

EXAMPLE

This example describes the synthesis of nanoparticle ligands (referred to here as charge control agents; CCAs) having multiamine head groups and polyethylene oxide or polypropylene oxide tail groups.

The reaction scheme used in one embodiment of a ligand synthesis is shown in FIG. 1. The first step in this synthesis is a Michael addition reaction which proceeds at room temperature. The second reaction uses a primary amine and a methyl ester to form an amide. The only by-product of that reaction is methanol, which may be easily removed from the product by vacuum. The reaction can be heated to push the reaction forward but should proceed under the toluene or xylene refluxing conditions. Once the product is formed, it may be isolated by simply removing the volatile components.

Figure 2:
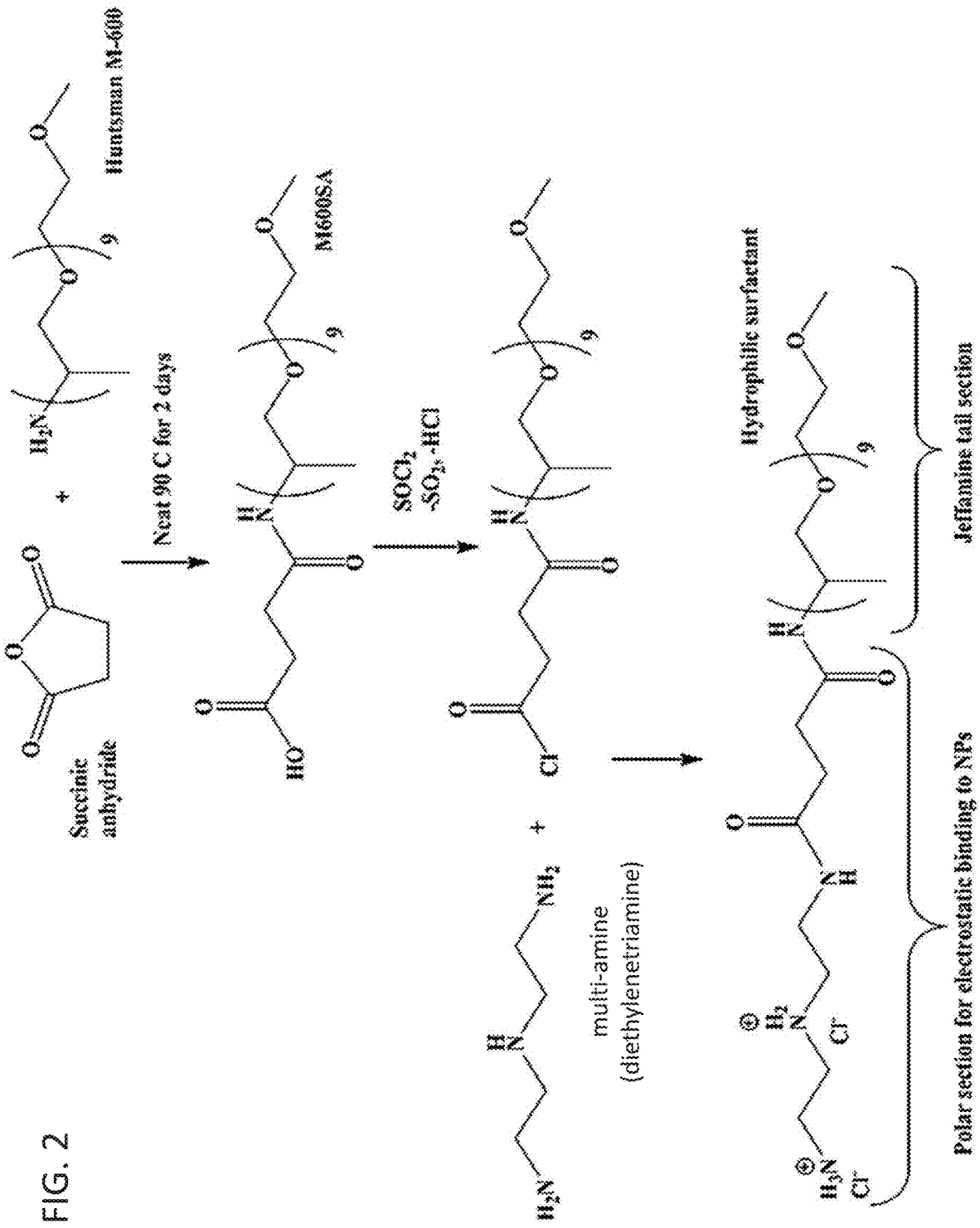
FIG. 2. Another embodiment of a reaction scheme for the synthesis of a ligand having a multiamine head group.
Figure 3:
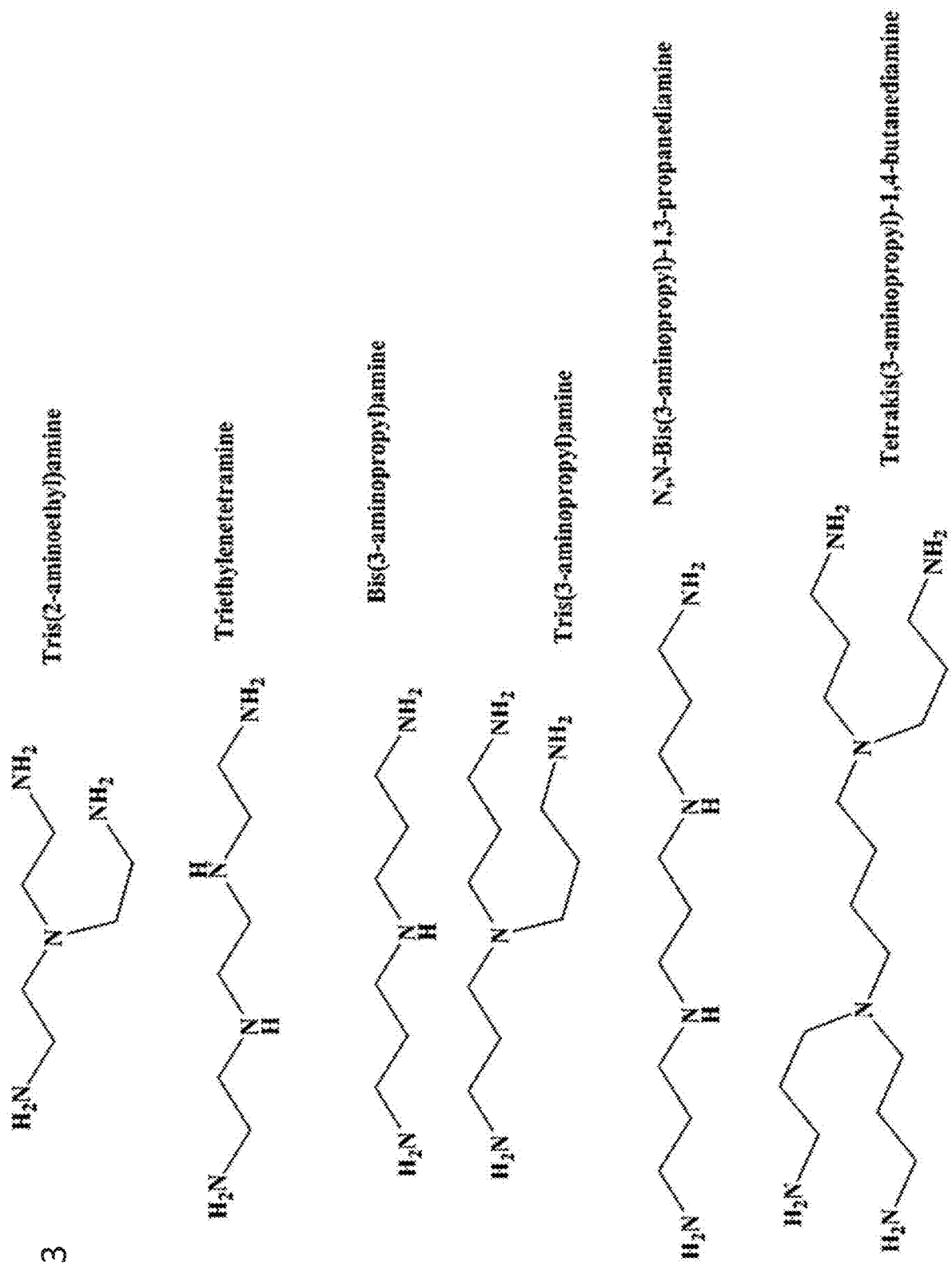
FIG. 3. Multiamine reactants that can be used in the syntheses of ligands having multiamine head groups.

The reaction scheme used in another embodiment of a ligand synthesis is shown in FIG. 2. This scheme begins with the synthesis of a carboxylic acid-terminated ligand ("M600SA") from succinic anhydride and a polyether monoamine (Jeffamine® M-600). The next two steps are an amide synthesis through an acid chloride intermediate formed from the carboxylic acid of M600SA. Although there are several ways to form an acid chloride from a carboxylic acid, when thionyl chloride ($SOCl_2$) is used the by-products are one equivalent of the gaseous $SO_2$ and gaseous hydrochloric acid (HCl). Upon formation of the by-products, $SO_2$ will be released from the solution. The HCl may stay in solution depending on the nature of the reaction solvent. Once a multiamine is added, the reaction with acid chloride is fast and releases a second equivalent of HCl. The other amines push the equilibrium forward by absorbing that equivalent of HCl, and the product is isolated with two equivalents of an ammonium chloride salt. Solvent removal by vacuum may remove a portion of the HCl complexed to the ammonium hydroxide. The amount of ammonium salt may be increased by reaction with HCl gas (or an equivalent reagent such as HCl in MeOH), or the chloride may be replaced by another counter ion, such as acetate or triflate, by reaction with another acid. Additionally, the CCA could be synthesized with between one and five multiple charges on the surface binding section, depending upon the polyamine used in the synthesis.

Although diethylenetriamine is used as the multiamine reactant in the schemes shown in FIG. 1 and FIG. 2, other multiamine reactants can be used to form ligands with different polyamine chains in their head groups. The structures of some commercially available multiamines available from Aldrich are shown below. These can be used in the reaction schemes illustrated in FIG. 1 and FIG. 2 instead of diethylenetriamine to form their respective ligands. The stoichiometry of the reaction can be used to determine the structure of the resulting ligands. For example, the stoichiometry can be designed to produce ligands with branched multiamine head groups and a single tail group and/or ligands with more than one tail group. Similarly, other polyether amines, such as Jeffamine® M-1000, M-2005, or M-2070, could be used in the reaction schemes in FIG. 1 and FIG. 2 to form their respective ligands.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of forming a film in a photonic device, the method comprising:
   inkjet printing a layer of an acrylate-based ink composition on a substrate; and
   curing the ink composition, wherein the ink composition comprises a plurality of ligand-capped nanoparticles, at least a portion of the ligand-capped nanoparticles comprising:
      an inorganic nanoparticle having a surface, the nanoparticle being a metal oxide nanoparticle, a metalloid oxide nanoparticle, or a metal nanoparticle; and
      a ligand bonded to the surface, the ligand comprising:
         a first group comprising at least one quaternary amine bound to the surface of the nanoparticle; and
         a second group comprising a polyalkylene oxide.

2. The method of claim 1, wherein the ink composition further comprises an organic counterion.

3. The method of claim 1, wherein the ink composition comprises monofunctional and multi-functional (meth)acrylate molecules.

4. The method of claim 1, wherein the nanoparticles are scattering nanoparticles, the ink composition further comprises a plurality of ligand-capped quantum dots, the ligand bonded to the surface of the scattering nanoparticles is a first ligand, the ligand bonded to the surface of the quantum dots is a second ligand, and the first ligand is different from the second ligand.

5. The method of claim 4, wherein at least a portion of the ligands are diblock ligands.

6. The method of claim 1, wherein the total concentration of the ligand-capped nanoparticles in the ink composition is from 1 wt. % to 50 wt. %.

7. The method of claim 6, wherein the ink composition further comprises a plurality of ligand-capped quantum dots.

8. The method of claim 1, wherein the plurality of ligand-capped nanoparticles is a first plurality, and further comprising a second plurality of ligand-capped nanoparticles, each of the second plurality of ligand-capped nanoparticles comprising an inorganic nanoparticle having a surface and a diblock ligand having a first portion bonded to the surface, the first group comprising a carboxyl group, an amine group, a thiol group, or a combination thereof, and a second portion comprising a polyalkylene oxide chain.

9. The method of claim 3, wherein the monofunctional and multi-functional (meth)acrylate molecules comprise mono(meth)acrylate and di(meth)acrylate molecules.

10. The method of claim 1, wherein the ink composition further comprises a solvent.

11. A method of forming a film in a photonic device, the method comprising:
   inkjet printing a layer of an acrylate-based ink composition on a substrate; and
   curing the ink composition, wherein the ink composition comprises a plurality of ligand-capped metal oxide nanoparticles, ligand-capped metalloid oxide nanoparticles, ligand-capped metal nanoparticles, ligand-capped semiconductor nanoparticles, or a combination thereof, each ligand-capped nanoparticle having a surface and a ligand bonded to the surface, at least a portion of the ligands comprising:
      a first group comprising at least one quaternary amine bound to the surface of the nanoparticle; and
      a second group comprising a polyalkylene oxide.

12. The method of claim 11, wherein the total concentration of the ligand-capped nanoparticles in the ink composition is from 1 wt. % to 50 wt. %.

13. The method of claim 11, wherein the ink composition further comprises an organic counterion.

14. The method of claim 11, wherein the ink composition further comprises monofunctional and multi-functional (meth)acrylate molecules.

15. The method of claim 11, wherein the ink composition further comprises a solvent.

16. The method of claim 11, wherein the nanoparticles comprise a plurality of scattering nanoparticles and a plurality of quantum dots, the ligand of the scattering nanoparticles is a first ligand, the ligand of the quantum dots is a second ligand different from the first ligand, and the first and second ligands are compatible.

17. A method of forming a film in a photonic device, the method comprising:
   obtaining an acrylate-based ink composition, comprising:
      a first plurality of nanoparticles capped with a first ligand; and
      a second plurality of nanoparticles capped with a second ligand, wherein the first plurality, the second plurality, or both contains scattering nanoparticles and quantum dots, the first ligand is different from the second ligand, the first ligand is compatible with the second ligand, and each of the first and the second ligand comprises a first portion having a functional group selected from the group consisting of a carboxyl group, an amine group, a thiol group, and a combination thereof, and a second portion that is a polyalkylene oxide chain;
   inkjet printing a layer of the acrylate-based ink composition on a substrate; and
   curing the ink composition.

18. The method of claim 17, wherein a total concentration of the first plurality of nanoparticles and the second plurality of nanoparticles in the ink composition is from 1 wt. % to 50 wt. %.

19. The method of claim 17, wherein the ink composition further comprises an organic counterion.

20. The method of claim 17, wherein the first portion of at least one ligand of the first plurality of nanoparticles, the second plurality of nanoparticles, or both, comprises a quaternary amine group.

\* \* \* \* \*